United States Patent [19]

Bokov et al.

[11] 3,933,609
[45] Jan. 20, 1976

[54] METHOD OF MAKING COLOURED PHOTOMASKS

[76] Inventors: Jury Sergeevich Bokov, K-482, korpus 338a, kv. 61; Valery Nikolaevich Gurzheev, K-498, korpus 406, kv. 56; Vladimir Ivanovich Zakharov, K-498, korpus 440, kv. 188; Vladimir Sergeevich Korsakov, K-482, korpus 350, kv. 24; Vadim Petrovich Lavrischev, K-460, ploschad Junosti, 4, kv. 22; Alla Grigorievna Goron, K-498, korpus 440, kv. 231, all of Moscow; Mark Leonovich Glikman, ulitsa Kommunarnaya, 11, kv. 45, Saratov; Nikolai Nikolaevich Semenov, ulita Zagorodnaya, 15, Kv. 56, Saratov; Viktor Yakovlevich Matvienko, ulitsa Tupikovaya, 1, Saratov, all of U.S.S.R.

[22] Filed: June 25, 1974

[21] Appl. No.: 482,841

[52] U.S. Cl................. 204/180 R; 65/30; 65/60; 117/124 C; 204/130; 204/181

[51] Int. Cl.$^2$................ B01K 5/00; C03C 17/00
[58] Field of Search............... 204/130, 180 R, 181; 117/212, 211, 217, 123 B, 124 C; 65/30, 60, 99 A

[56] References Cited
UNITED STATES PATENTS
3,622,295  11/1971  Loukes et al. ................... 65/30

*Primary Examiner*—John H. Mack
*Assistant Examiner*—A. C. Prescott
*Attorney, Agent, or Firm*—Haseltine, Lake & Waters

[57] ABSTRACT

The method of making coloured photomasks used in manufacture of printed-circuit boards and microcircuits, consisting in doping the surface of a glass substrate with a staining metal by virtue of a repeated electrodiffusion of the ions of the staining metal occurring from diverse melts, followed by reduction of the staining metal. Further on, a protective layer is applied to the glass substrate stained layer, corresponding to a predetermined pattern, the unprotected portions of the stained layer are removed and the protective layer is eliminated.

2 Claims, 7 Drawing Figures

METHOD OF MAKING COLOURED PHOTOMASKS

This invention relates generally to the art of microelectronics and more specifically it concerns a method of making coloured photomasks used in manufacture of printed-circuit boards and thin-film and integrated microcircuits.

It is commonly known to use nowadays the method of making photomasks, consisting in vacuum deposition of a thin metallic film upon a glass substrate, further establishing the required pattern made of a photoresist, on the thus-deposited metallic film and the subsequent elimination, by virtue of chemical etching, those portions of the metallic film that are not covered by the photoresist.

In said known method use is made for obtaining a metallic film of such metals as chromium, nickel, silver, copper, tungsten and molybdenum, though most widely practicable among these is chromium which features high attrition resistance and good adhesion to the surface of a glass substrate.

Such a metallized photomask obtained by said known method features high optic density; however, it suffers from some disadvantages as, say, opacity to visible light spectrum and high reflection factor which hinder its application in producing printed-circuit boards and microcircuits.

Another method is also widely known to use heretofore for producing a selectively light-transmitting emulsion photomask, however, its carrying into effect offers a number of difficulties concerned with the use of organic materials featuring absorption capacity in that wavelength spectrum to which the now-existing photoresists are sensitive.

All these disadvantages and drawbacks have been obviated in one more known method of making coloured photomasks, residing in that one surface of a flat glass substrate is doped with a staining metal (such as copper, gold, silver or indium), said substrate being moved with its other surface over an electrically-conductive melt, followed by colouring the doped surface of said glass substrate by reducing the staining metal, with subsequent formation of a protective doped layer on the stained surface of the glass substrate that corresponds to a desired pattern of image, whereupon the exposed (non-masked) portions of the glass substrate stained portions are removed and the doped masking layer is eliminated.

The thus-prepared coloured photomask features an optical density of the order of 1.5 units and a thickness of the glass substrate stained layer equal to about one micron.

Minimum width of a line of the desired pattern on the coloured photomask corresponds to a double thickness of the stained layer and, consequently, for a photomask obtained by said known method, said minimum line width equals 2 microns which proves to be insufficient in some cases. Giving preference to said known method of making coloured photomasks as the one making it possible to obtain low primary-cost products featuring high performance characteristics, it should however be pointed out that for a given particular range of problems a relatively low resolution of the obtained coloured photomasks cannot be considered as reasonably fair.

It is a primary object of the present invention to provide a method of making coloured photomasks having high optical density.

It is another object of the present invention to provide a method of making coloured photomasks having a minimum stained layer thickness.

It is one more object of the present invention to provide a method of making coloured photomasks having essentially large effective area.

According to said and other objects the essence of the present invention resides in that in a method making coloured photomasks, consisting in doping one of the surfaces of a flat glass substrate with a staining metal (such as copper, gold, silver or indium), while with its other surface said glass substrate is moved over an electrically conducting melt, whereupon said former surface of the glass substrate is stained by way of reduction of the staining metal, followed by the formation of a protective layer on the stained layer of the glass substrate which protective layer corresponds to a predetermined pattern, with subsequent removal of non-protected portions of the stained layer and elimination of the protective layer, according to the invention, prior to doping said surface of the glass substrate, there is carried out an electrodiffusion of the ions of the staining metal occurring from a melt of lead with said staining metal, followed by reduction of the latter, whereas doping is effected by repeated electrodiffusion of the ions of the staining metal occurring from a melt of the staining metal with lead, tin, bismuth or thallium.

In what follows the present invention is illustrated in a disclosure of specific exemplary embodiments thereof to be had in conjunction with the accompanying drawings, wherein.

Figure 1:
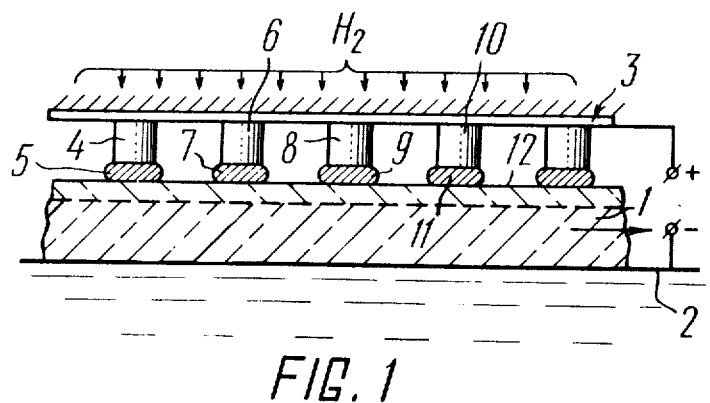
FIG. 1 is a diagrammatic view of an installation for carrying into effect the herein-proposed method of making coloured photomasks, according to the invention.
Figure 5:
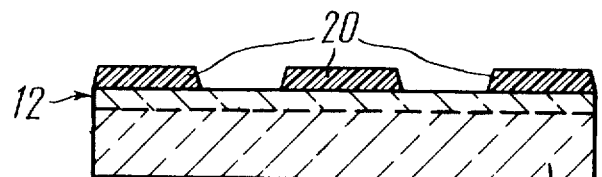
FIG. 5 is a sectional view of a glass substrate carrying a stained layer and a protective layer formed therein, according to the invention.

Now let us consider a specific exemplary embodiment of the herein-proposed method for making coloured photomasks.

A flat glass substrate 1 (FIG. 1) which is essentially a sheet glass, heated to 600°–800°C is moved in a reducing atmosphere of hydrogen in the direction shown by arrow A, over a surface 2 of molten tin, which surface is an electrically conducting one. Any other conducting substance may, however, be made use of for the purpose.

The outside surface of the substrate 1 carries a system 3 of electrodes which system is connected to the positive pole of a direct current source whose negative pole is connected to the surface 2 of molten tin. In said system 3 of electrodes a first electrode 4 is electrically connected to the outside surface of the substrate 1 through a melt 5 of lead with copper which is the staining metal, a second electrode 6 is electrically connected to said outside surface of the substrate 1 through a tin-copper melt 7, a third electrode 8, through a bismuth-copper melt 9 and a fourth electrode, through a thallium-copper melt 11, the alternation sequence of the melts 7, 9 and 11 being any.

The melt corresponding to every particular electrode is held thereon by any conventional method.

When the glass substrate 1 moves in the direction indicated by the arrow A, the outside surface of the substrate 1 first gets exposed to the effect of the electrode 4. As a result, an electrodiffusion occurs, i.e., copper ions from the melt 5, under the effect of electric field penetrate into the superficial layer of the substrate 1. The thickness of a doped layer 12 (i.e., saturated with copper ions) is the function of the time of action of the melt 5, of the current density and of the temperature to which the glass substrate 1 is heated. At the next moment copper ions are reduced under the effect of the reducing hydrogen atmosphere to the atomic state which results in red colouring of that portion of the substrate which has been exposed to the effect of the electrode 4. As the substrate 1 is further moved said stained portion gets consecutively exposed to the effect of the respective electrodes 6, 8 and 10 which produce similar effect to those referenced to the electrode 4 to successively intensify the colour of the layer 12 practically not increasing the thickness thereof.

This is called forth by a preparatory effect of the staining metal from the lead melt exerted upon the outside surface of the glass substrate 1 which establishes the conditions under which the thickness of the stained layer 12 during treatment of the glass surface with a staining metal (copper in this particular case) from the tin, bismuth and thallium melts, practically corresponds to the thickness obtained after the initial treatment with the electrode 4.

Figure 2:
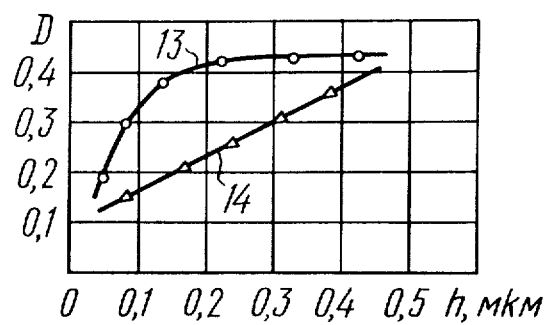
FIG. 2 is a curve of stained-layer optical density versus the thickness of said layer for diverse kinds of melts used, according to the invention.

FIG. 2 shows the optical density D (plotted against Y-axis of the stained layer as the function of the thickness $h$ (plotted against X-axis) of said layer formed due to the effect of the lead-copper melt 5 (FIG. 1) upon the substrate 1, represented graphically as a curve 13 (FIG. 2).

FIG. 2 shows also a curve 14 to indicate similar functional dependence for the case where the bismuth-copper melt 5 (FIG. 1) is used.

As it ensues from the above-stated characteristic curves, at the same values of the optical density D the thickness $h$ of the stained layer 12 (FIG. 1) is less in case of the lead-copper melt 5.

Figure 3:
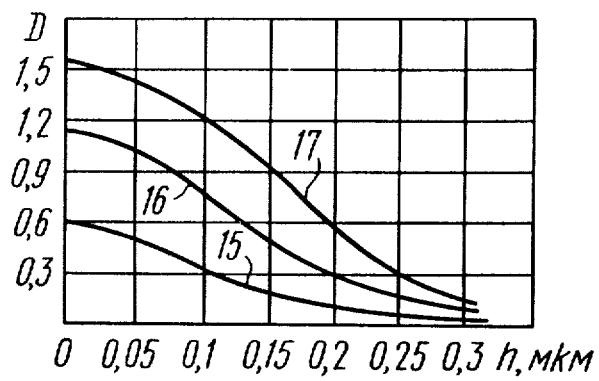
FIG. 3 is another curve of stained-layer optical density versus the thickness of said layer for diverse kinds of melts used, according to the invention.

When a lead-copper melt is used as the melts 7, 9 and 11 that exercise effect upon the substrate 1 after the latter has been exposed to the action of the melt 5, an increase in the optical density does not practically enlarge the thickness of the layer 12 which ensues from the characteristic curves represented in FIG. 3.

Herein a curve 15 represents graphically the optical density D versus the thickness $h$ of the stained layer 12 (FIG. 1) after the effect of the melt 5 which is defined by way of successively decreasing the thickness of the layer 12 in virtue of eliminating some portions of the stained layer 12.

Next curves 16 and 17 (FIG. 3) show similar functional dependence displayed but after the substrate 1 has undergone the effect of the melts 7 and 9 (FIG. 1).

Figure 4:
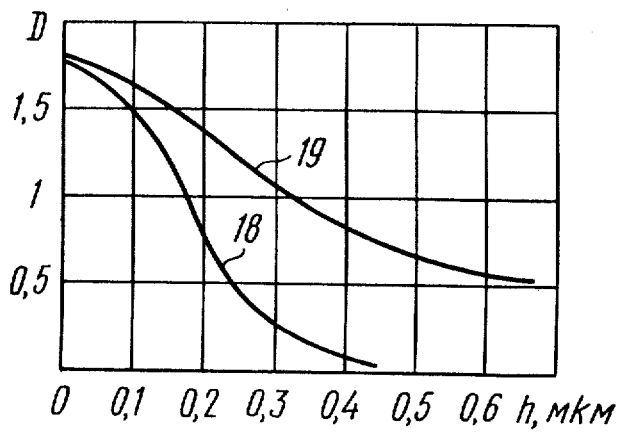
FIG. 4 is one more curve of stained-layer optical density versus the thickness of said layer for diverse kinds of melts used, according to the invention.

FIG. 4 illustrates the functional dependence of the optical density D upon the thickness $h$ of the stained layer 12 (FIG. 1) obtained due to the effect produced upon the substrate 1 by the lead-copper melt 5 and by the subsequent repeated effect by the bismuth-copper melts 7, 9 and 11 represented graphically by a curve 18 (FIG. 4), as well as the functional dependence of the optical density D upon the thickness $h$ of the stained layer 12 (FIG. 1) obtained by exposing the substrate 1 to the effect of the bismuth-copper melt 5 followed by a repeated effect of the bismuth-copper melts 7, 9 and 11 as represented graphically by a curve 19 (FIG. 4).

It ensues from the analysis of the afore-stated characteristic curves that the required optical density D is obtained at less thickness $h$ of the stained layer 12 (FIG. 1) whenever the substrate 1 is additionally subjected to doping from the lead-copper melt 5 preparatory to being exposed to a repeated doping from the melts 7, 9 and 11.

Upon subjecting the substrate 1 to the effect of the melts 5, 7, 9 and 11 there is obtained the stained layer 12 therein of the required optical density D (i.e., colour intensity) and thickness $h$.

Figure 6:
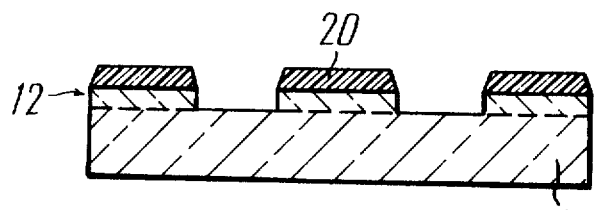
FIG. 6 is a sectional view of the glass substrate of FIG. 5 with the unprotected portions of the stained layer removed, according to the invention.
Figure 7:
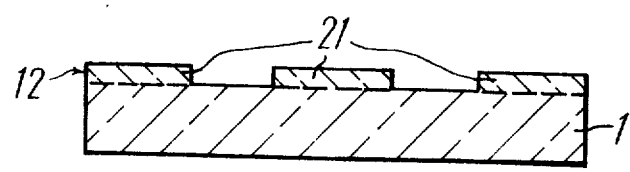
FIG. 7 is a sectional view of a resultant coloured photomask, according to the invention.

Further on, by resorting to any of the known conventional techniques a protective (masking) layer 20 is formed from a photoresist on the stained layer 12 of the substrate 1, corresponding to the required pattern or image. At the next moment the nonprotected portions of the stained layer 12 (FIG. 6) are removed, whereupon the protective photoresist layer 20 is eliminated. FIG. 7 depicts a sectional view of a resultant coloured photomask showing portions 21 of the stained layer 12 which correspond to the required pattern.

Used as a staining metal may be copper, gold, silver or indium. Whenever use is made of copper as a staining metal (which is the case in the aforestated disclosure), the portions 21 are coloured dark-red, whereas in case of using some other staining metal (viz., gold, silver, indium) the process for producing coloured photomasks remains unaffected as compared to that considered hereinbefore, the only difference being in that the stained portions 21 display other colours. Particularly the use of gold results in the portions 21 coloured light-red, while silver or indium produces the yellow-coloured portions 21.

To obtain the stained layer 12 of the required thickness and optical density the number of melts used to produce effect upon the substrate after that produced by the melt 5 may be any, the process for producing coloured photomasks remaining in this case unaffected.

Besides, such melts may feature any composition selected from those stated hereinbefore.

The use of a preliminary effect of a melt of lead with a staining metal upon the surface of the substrate 1 makes it possible to obtain the required thickness of the stained layer 12 ranging from 0.3 to 0.4 micron.

This is concerned with the fact that lead penetrates into glass for a depth up to 4 microns, and the following electrodiffusion of the staining metal occurs in the already modified layer of the glass substrate 1, featuring the electrodiffusion factor of the staining metal much less than that in the starting layer.

The method of a successive effect of the melts 7, 9 and 11 (FIG. 1) establishes the conditions for a uniform formation of the stained coating over the entire surface of the glass substrate under treatment which amounts practically to a few square meters.

All this enables the production of coloured photomasks having a great effective area the pattern on which features a minimum line size down to 1 micron and even minuter.

Formation of the stained layer 12 may occur in the production process of polished glass from tin melt which cuts down much the prime cost of glass substrate for coloured photomasks as compared to the known ones.

What is claimed is:

1. A method of making colored photomasks, consisting in doping a first surface of a flat glass substrate with a staining metal, selected from the group, consisting of copper, gold, silver and indium, moving a second surface of said glass substrate over an electrically conducting melt, said doping being effected by virtue of an electric diffusion of the ions of said staining metal occurring from the melt of lead with said staining metal, followed by reduction of said staining metal and by subsequent doping of said first surface of mentioned glass substrate by way of a repeated electric diffusion of the ions of said staining metal occurring from the melt of said staining metal with the metal selected from the group, consisting of lead, tin, bismuth and thallium, followed by reduction of said staining metal, forming a protective layer on the stained layer of said glass substrate, corresponding to a predetermined pattern, and removing the unprotected portions of said stained layer and elimination of said protective layer, said photomasks having a substantially high optical density and minimum stained layer thickness, said photomasks having substantially large effective area.

2. The method as defined in claim 1 wherein the surface layer of the glass has a thickness less than 0.3 $\mu$m, the optical density of the surface layer of the glass being within the range of 1.5 to 1.7 units.

* * * * *